(12) United States Patent
Yu et al.

(10) Patent No.: US 12,040,388 B2
(45) Date of Patent: Jul. 16, 2024

(54) LATERAL BIPOLAR TRANSISTORS

(71) Applicant: GLOBALFOUNDRIES U.S. Inc., Malta, NY (US)

(72) Inventors: Hong Yu, Clifton Park, NY (US); Judson R. Holt, Ballston Lake, NY (US); Alexander Derrickson, Saratoga Springs, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 40 days.

(21) Appl. No.: 17/525,634

(22) Filed: Nov. 12, 2021

(65) Prior Publication Data
US 2023/0066437 A1 Mar. 2, 2023

Related U.S. Application Data

(60) Provisional application No. 63/237,177, filed on Aug. 26, 2021, provisional application No. 63/236,899, filed on Aug. 25, 2021.

(51) Int. Cl.
*H01L 29/735* (2006.01)
*H01L 29/08* (2006.01)
(Continued)

(52) U.S. Cl.
CPC ........ *H01L 29/735* (2013.01); *H01L 29/0808* (2013.01); *H01L 29/0821* (2013.01);
(Continued)

(58) Field of Classification Search
CPC ............... H01L 29/735; H01L 29/0808; H01L 29/0821; H01L 29/1008; H01L 29/165; H01L 29/6625; H01L 29/063; H01L 29/6656; H01L 29/0649; H01L 29/0847; H01L 29/0673; H01L 29/775; H01L 29/66439; H01L 29/78696; H01L 29/42392; H01L 29/36; H01L 27/0623; H01L 27/0823; H01L 21/76897; H01L 21/823493; H01L 21/823475; H01L 21/823468; H01L 21/82285; H01L 21/823821; H01L 21/04; H01L 21/331; H01L 21/8222; H01L 21/8229;
(Continued)

(56) References Cited

U.S. PATENT DOCUMENTS 6,756,278 B2 * 6/2004 Yuki ..................... H01L 29/737
257/E29.188
6,949,764 B2 9/2005 Ning
(Continued)

OTHER PUBLICATIONS

Derrickson et al., "Assessment of THz Performance for a Lateral SiGe HBT on SOI With a Laterally Graded Base", IEEE Transactions on Electron Devices, vol. 65, Issue11, Nov. 2018, 8 pages.

*Primary Examiner* — Natalia A Gondarenko
(74) *Attorney, Agent, or Firm* — Francois Pagette; Andrew M. Calderon; Calderon Safran & Cole, PC (57) ABSTRACT

The present disclosure relates to semiconductor structures and, more particularly, to a lateral bipolar transistor and methods of manufacture. The structure includes: an extrinsic base having at least one sidewall with a gradient concentration of semiconductor material; an emitter on a first side of the extrinsic base; and a collector on a second side of the extrinsic base.

20 Claims, 10 Drawing Sheets

(51) Int. Cl.
*H01L 29/10* (2006.01)
*H01L 29/165* (2006.01)
*H01L 29/66* (2006.01)

(52) U.S. Cl.
CPC ........ *H01L 29/1008* (2013.01); *H01L 29/165* (2013.01); *H01L 29/6625* (2013.01)

(58) Field of Classification Search
CPC .. H01L 21/8249; H01L 31/11; H01L 31/1105; H01L 2924/1305; H01L 2924/13056; H01L 29/04; H01L 29/0804; H01L 29/0834; H01L 29/1004; H01L 29/0696; H01L 29/41708; H01L 29/42304; H01L 29/66234; H01L 27/0229; H01L 27/0244; H01L 27/0262; H01L 27/0263; H01L 27/082; H01L 27/0828; H01L 27/102; H01L 27/1022; H01L 27/11801; H01L 27/11896; H01L 27/2445; H01L 29/66348; H01L 29/66265; H01L 29/66295; H01L 29/66303; H01L 29/66325; H01L 29/66333; H01L 29/66287; H01L 29/66242; H01L 29/7378; H01L 29/732; H01L 29/739; H01L 29/7398; H01L 29/7325; H01L 29/0817; H01L 29/7375; H01L 29/7393; H01L 29/7395; H01L 29/7397
USPC .......... 257/273, 565, 586, 592; 438/309–327
See application file for complete search history.

(56) References Cited

U.S. PATENT DOCUMENTS

| | | | |
|---|---|---|---|
| 6,972,466 B1* | 12/2005 | Liang | H01L 29/735 257/376 |
| 8,288,758 B2 | 10/2012 | Ning et al. | |
| 8,420,493 B2 | 4/2013 | Ning et al. | |
| 8,586,441 B1 | 11/2013 | Cai et al. | |
| 9,437,718 B1* | 9/2016 | Cai | H01L 29/0649 |
| 9,997,619 B1* | 6/2018 | Balakrishnan | H01L 29/1008 |
| 10,825,921 B2 | 11/2020 | Balakrishnan et al. | |
| 2005/0101096 A1* | 5/2005 | Li | H01L 29/737 438/316 |
| 2012/0139009 A1* | 6/2012 | Ning | H01L 29/7317 257/E29.187 |
| 2013/0260526 A1* | 10/2013 | Cai | H01L 29/66242 257/E21.608 |
| 2019/0165150 A1* | 5/2019 | Hashemi | H01L 29/1008 |
| 2020/0286995 A1* | 9/2020 | Hashemi | H01L 29/737 |
| 2022/0045174 A1* | 2/2022 | Suligoj | H01L 29/401 |

* cited by examiner

LATERAL BIPOLAR TRANSISTORS

BACKGROUND

The present disclosure relates to semiconductor structures and, more particularly, to lateral bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an extrinsic base comprising at least one sidewall with a gradient concentration of semiconductor material; an emitter on a first side of the extrinsic base; and a collector on a second side of the extrinsic base.

In an aspect of the disclosure, a structure comprises: an extrinsic base comprising a core of a first semiconductor material and a second semiconductor material, and a sidewall with a gradient concentration of the second semiconductor material; a raised emitter of comprising the first semiconductor material on a first side of the extrinsic base; and a raise collector of the first semiconductor material on a second side of the extrinsic base.

In an aspect of the disclosure, a method comprises: forming an extrinsic base comprising at least one sidewall with a gradient concentration of semiconductor material; forming an emitter on a first side of the extrinsic base; and forming a collector on a second side of the extrinsic base.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to lateral bipolar transistors and methods of manufacture. More specifically, the present disclosure relates to lateral bipolar transistors with a SiGe base comprising a gradient concentration of, for example, Ge, in fully depleted semiconductor on insulator (SOI) technology. Advantageously, the lateral bipolar transistor provides for high voltage RF device applications (e.g., low noise amplifiers and power amplifiers), with the SOI technology providing additional benefits of reduced capacitance and noise isolation.

In more specific embodiments, the lateral bipolar transistor includes an ultra-narrow base (Wb) comprising a SiGe core with a SiGe sidewall having a gradient concentration of Ge, e.g., graded SiGe sidewall portion(s). In embodiments, the width of the SiGe core may be between 2 nm to 20 nm; although other dimensions are also contemplated herein depending on desired device performance and specific application. The graded SiGe portions may be grown from one or both sidewalls of the SiGe core. For example, the graded SiGe portions may be formed on an emitter side of the lateral bipolar transistor, a collector side of the lateral bipolar transistor or both the emitter side and collector side of the lateral bipolar transistor.

The SiGe portions on the one or more sidewalls may be tunable with a preferred profile, e.g., Ge concentration. For example, the graded SiGe portions on one or both sides of the SiGe core may have a Ge concentration ranging from about 0% to about 50% (although other concentrations are contemplated herein). The grading may comprise a uniform lateral Ge grading or, in embodiments, may include a higher Ge concentration closer to the collector region or the emitter region. Moreover, an additional SiGe region may be grown above the SiGe core. In embodiments, due to the fabrication processes, the additional SiGe region may be formed with a very thin width, e.g., about 3 nm to about 6 nm, with 5 nm target.

The lateral bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistor of the present disclosure have been adopted from integrated circuit (IC) technology. For example, the structures are built on wafers and are realized in films of material patterned by photolithographic processes on the top of a wafer. In particular, the fabrication of the lateral bipolar transistor uses three basic building blocks: (i) deposition of thin films of material on a substrate, (ii) applying a patterned mask on top of the films by photolithographic imaging, and (iii) etching the films selectively to the mask. In addition, as is known in the art, precleaning processes may be used to clean etched surfaces of any contaminants, as is known in the art. Moreover, when necessary, a rapid thermal anneal processes may be used to drive-in dopants or material layers as is known in the art.

Figure 1:
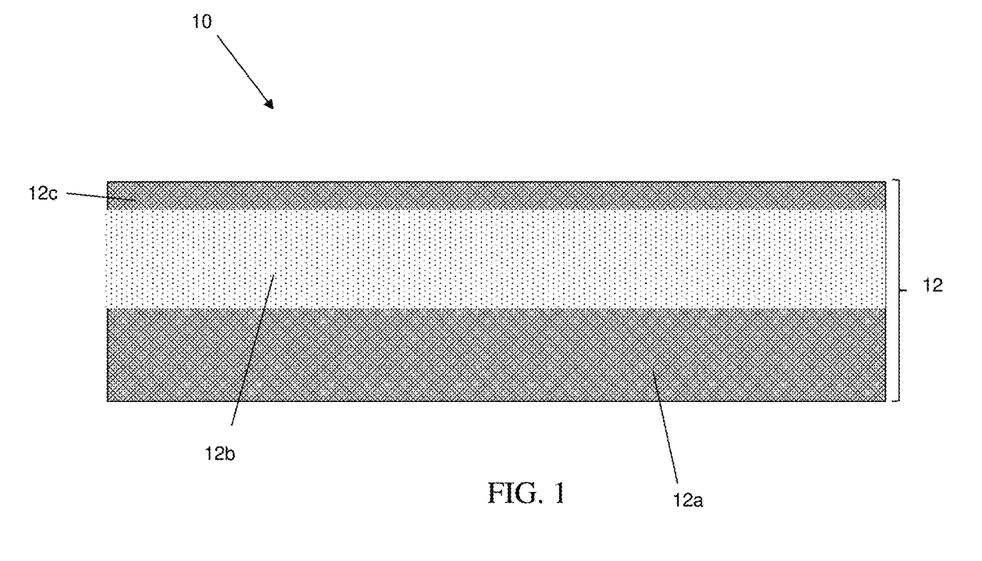
FIG. 1 shows a starting substrate, amongst other features, and respective fabrication processes in accordance with aspects of the present disclosure.

FIG. 1 shows a starting substrate in accordance with aspects of the present disclosure. In particular, the structure 10 of FIG. 1 includes a substrate 12 comprising a semiconductor-on-insulator (SOI) substrate. The semiconductor-on-insulator (SOI) substrate 12 includes a semiconductor handle wafer 12a, an insulator layer 12b and a semiconductor layer 12c on the insulator layer 12b. The semiconductor handle wafer 12a provides mechanical support to the insulator layer 12b and the semiconductor layer 12c. The semiconductor layer 12c may be formed by a deposition process, such as chemical vapor deposition (CVD) or plasma enhanced CVD (PECVD). Alternatively, the semiconductor layer 12c may be formed using a smart cut process where two semiconductor wafers are bonded together with an insulator material between the two semiconductor wafers.

In the SOI implementation, the semiconductor handle wafer 12a and the semiconductor layer 12c may be composed of any suitable semiconductor material including, but not limited to, Si, SiGe, SiGeC, SiC, GaAs, InAs, InP, and other III/V or II/VI compound semiconductors. Moreover, the semiconductor handle wafer 12a and the semiconductor layer 12c may comprise any suitable single crystallographic orientation (e.g., a (100), (110), (111), or (001) crystallographic orientation). In further embodiments, the semiconductor handle wafer 12a may be a P+ substrate. The semiconductor layer 12c may be a fully depleted semiconductor material that is thinned using a conventional oxidation process followed by an etching process to remove the oxidized portion of the semiconductor layer 12c. The semiconductor layer 12c may be thinned to about 1 nm to about 20 nm; although other dimensions are also contemplated herein.

The insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In further embodiments, the insulator layer 12b may be formed using a thermal growth process, such as thermal oxidation, to convert a surface portion of the semiconductor handle wafer 12a to an oxide material, e.g., insulator layer 12b. In yet another embodiment, the insulator layer 12b can be formed by implanting oxygen atoms into a bulk semiconductor substrate and thereafter annealing the structure.

Figure 2:
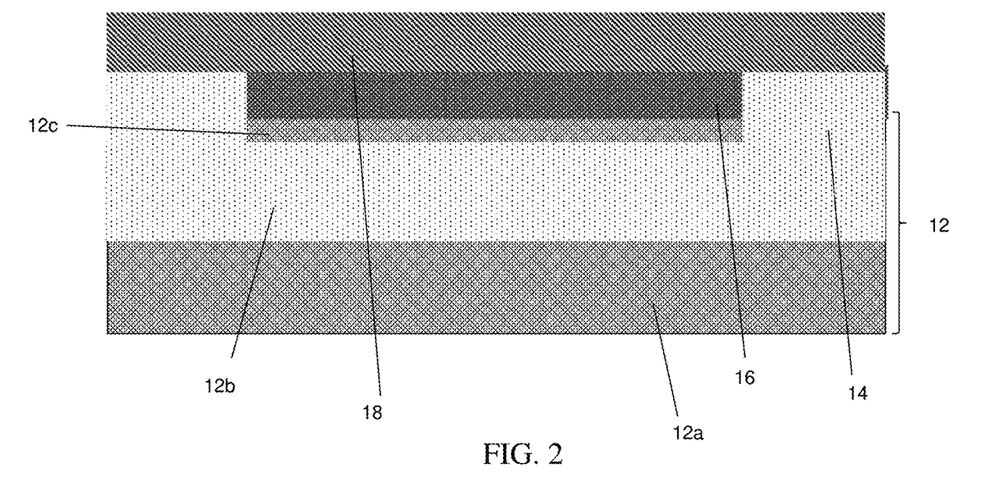
FIG. 2 shows a semiconductor material formed on the starting substrate and shallow trench isolation structures, amongst other features, and respective fabrication processes in accordance with aspects of the present disclosure.

Referring to FIG. 2, a semiconductor material 16 may formed on the semiconductor layer 12c. In embodiments, the semiconductor material 16 may be SiGe material which is epitaxially grown on the semiconductor layer 12c using conventional epitaxial processes such that no further explanation is required herein for a complete understanding of the present disclosure. The semiconductor material 16 may be in situ doped with a P+ dopant, e.g., boron, during the epitaxial growth process, with a Ge concentration of about 40% as one non-limiting example. In embodiments, the semiconductor material 16 may have a depth of about 10 nm to 30 nm, which may be used for a core of the extrinsic base of the lateral bipolar transistor.

Shallow trench isolation structures 14 are formed within the semiconductor layer 12c and semiconductor material 16, extending to the insulator layer 12b. The shallow trench isolation structures 14 can be formed by conventional lithography, etching and deposition methods known to those of skill in the art. For example, a resist formed over the semiconductor material 16 is exposed to energy (light) to form a pattern (opening). An etching process with a selective chemistry, e.g., reactive ion etching (RIE), will be used to form one or more trenches in the semiconductor layer 12c and the semiconductor material 16 through the openings of the resist. Following the resist removal by a conventional oxygen ashing process or other known stripants, insulator material (e.g., $SiO_2$) can be deposited within the trenches by any conventional deposition process, e.g., chemical vapor deposition (CVD) processes. Any residual insulator material on the surface of the semiconductor material 16 may be removed by conventional chemical mechanical polishing (CMP) processes.

Following the fabrication of the shallow trench isolation structures 14, a capping material 18 may be formed over the shallow trench isolation structures 14 and the semiconductor material 16. In embodiments, the capping material 18 may be a nitride material that is deposited over the shallow trench isolation structures 14 and the semiconductor material 16. For example, the capping material 18 may be deposited using a conventional deposition method, e.g., CVD.

Figure 3:
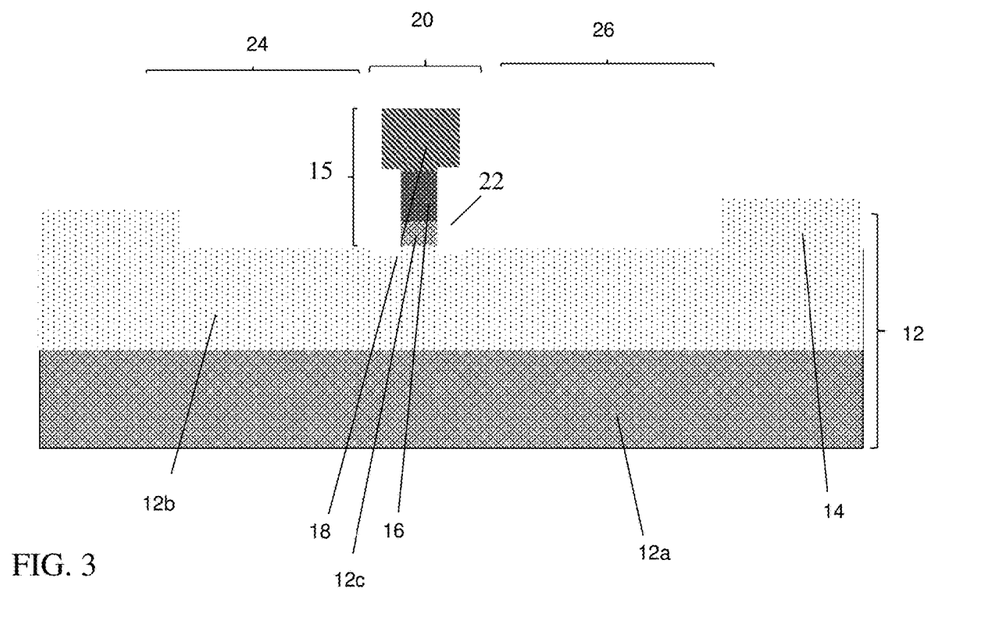
FIG. 3 shows a pillar structure with recessed sidewalls, amongst other features, and respective fabrication processes in accordance with aspects of the present disclosure.

FIG. 3 shows a patterning of the capping material 18, semiconductor material 16, and semiconductor material 12c in an extrinsic base region 20. In embodiments, the capping material 18, the semiconductor material 16, and the semiconductor material 12c may be patterned into a pillar 15 using conventional lithography and etching processes as already described herein. The pillar 15 may comprise a core of the extrinsic base region. Due to the etching process, the underlying insulator layer 12b may be exposed between the shallow trench isolation structures 14.

Still referring to FIG. 3, recesses 22 are formed on an emitter side 24 and a collector side 26 of the pillar 15. In embodiments, the recesses 22 are below the capping material 18 and may be formed by conventional etching processes, with chemistries that are selective to the semiconductor material 16 and semiconductor layer 12c. In embodiments, the recesses 22 may be about 2 nm to about 40 nm in depth and a height of the combination of the semiconductor materials 12c, 18, e.g., about 10 nm to about 30 nm; although other dimensions are also contemplated herein. The remaining portion of the pillar 15 may be used as the extrinsic base with a width dimension of about 3 nm to about 6 nm with a target of about 5 nm.

Figure 4:
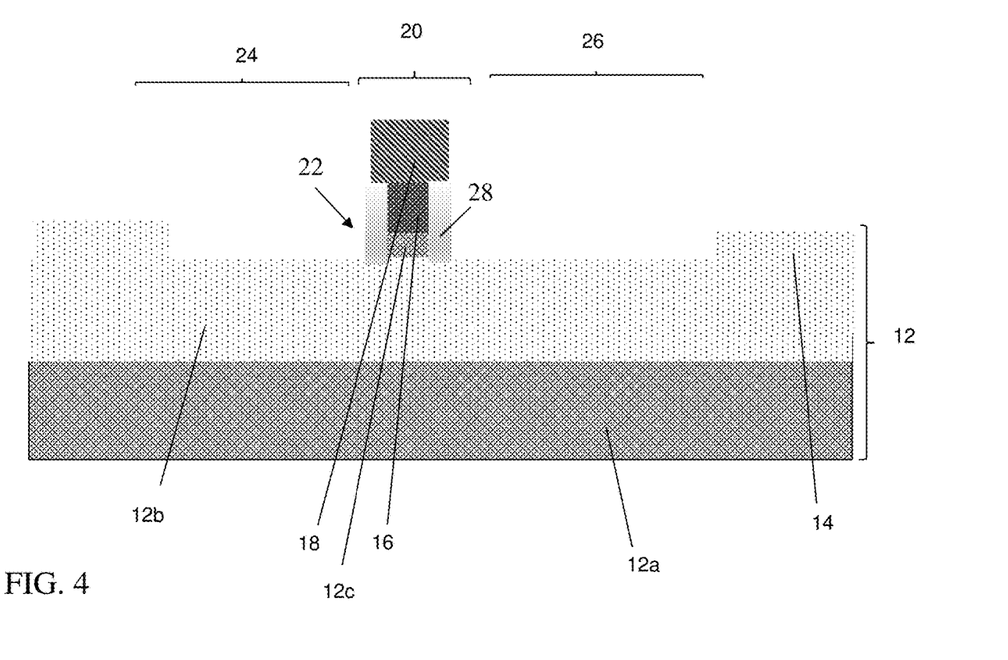
FIG. 4 shows an epitaxial semiconductor material with a gradient concentration within the recesses, amongst other features, and respective fabrication processes in accordance with aspects of the present disclosure.

As shown in FIG. 4, an epitaxial semiconductor material 28 may be formed in the recesses 22, on sides of the patterned semiconductor material 16 and semiconductor layer 12c. In embodiments, the semiconductor material 28 may be p-doped SiGe material having a thickness of about 2 nm to about 40 nm. The SiGe material 28 may comprise a gradient (e.g., graded) concentration of Ge material, e.g., ranging from a Ge concentration of about 0% to 50%. In embodiments, the concentration of Ge may be from a smaller % concentration of Ge to a larger % concentration of Ge, starting at an inner portion continuing to an outer portion. In an alternative embodiment, the concentration of the Ge may be from a larger % concentration of Ge to a smaller % concentration of Ge, starting at an inner portion continuing to an outer portion. Also, in embodiments, the capping material 18 may prevent faceting of the semiconductor material 28, e.g., the semiconductor material 28 may be rectangular in shape (e.g., not faceted).

Figure 5:
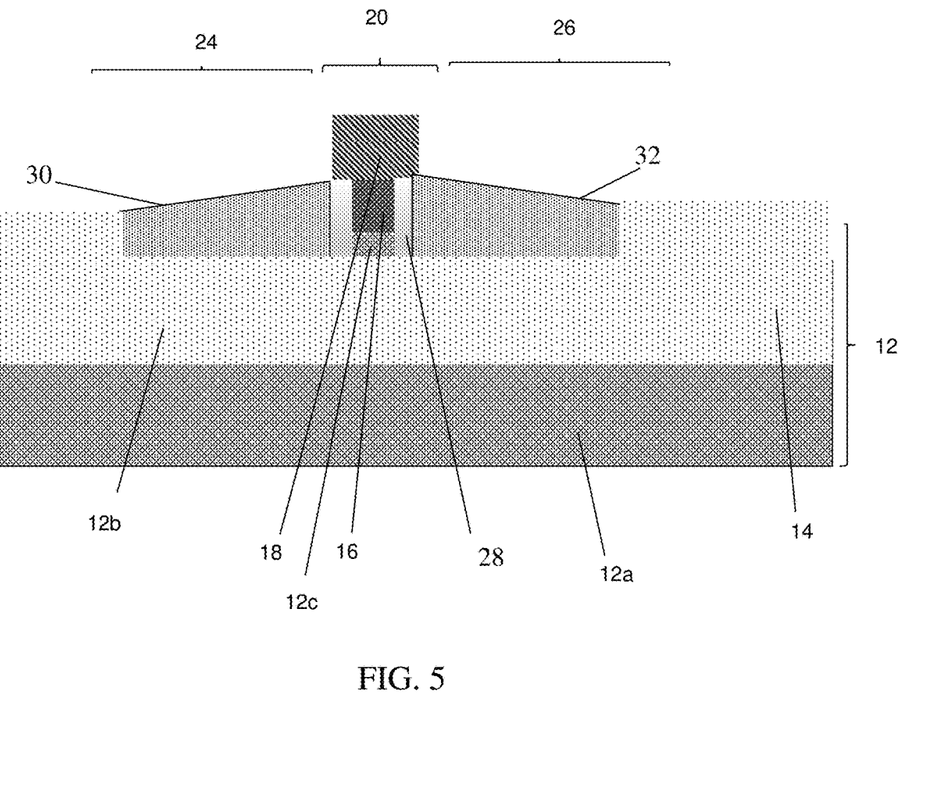
FIG. 5 shows a raised emitter region and a raised collector region, amongst other features, and respective fabrication processes in accordance with aspects of the present disclosure.

In FIG. 5, epitaxial semiconductor material 30 may be formed on the emitter side 24 and epitaxial semiconductor material 32 may be formed on the collector side 26. In embodiments, the epitaxial semiconductor materials 30, 32 will grow outwards from the semiconductor material 28. In this way, the epitaxial semiconductor material 30 may be a raised emitter region; whereas the epitaxial semiconductor material 32 may be a raised collector region. The semiconductor materials 30, 32 may be N+ doped Si material and, more specifically, may be SiP material lightly doped with N+ dopant. The N+ dopant may be, for example, arsenic or phosphorus, doped in-situ during an epitaxial growth process of the semiconductor material 30, 32.

Figure 6:
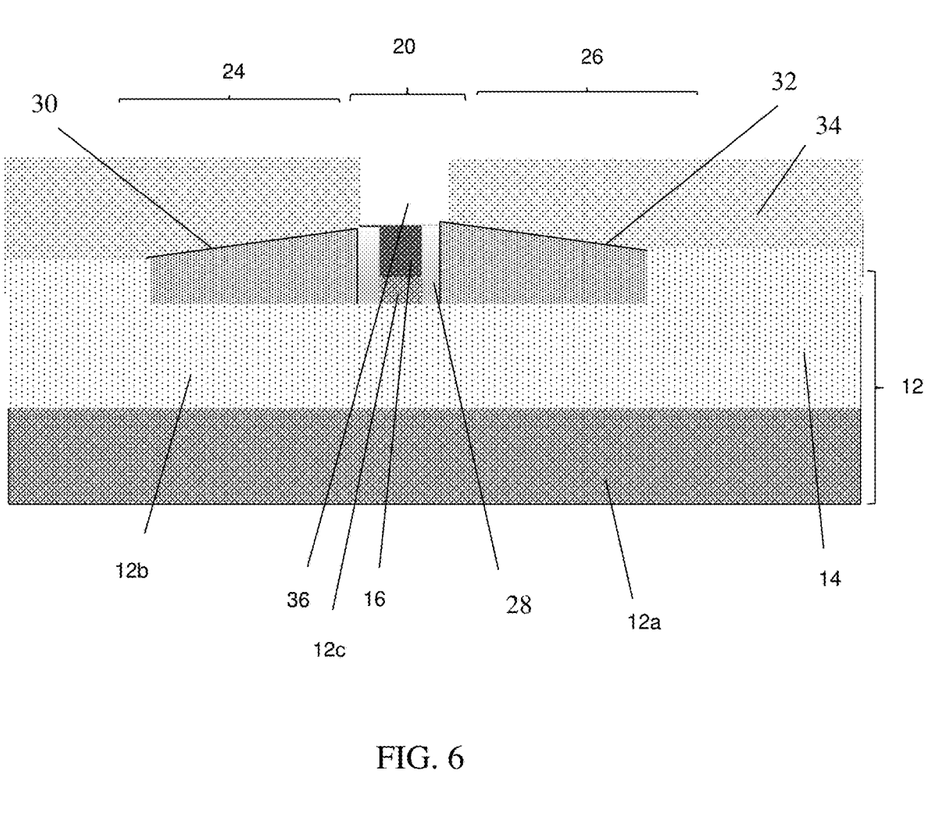
FIG. 6 shows an opening in dielectric material aligned with the pillar structure, amongst other features, and respective fabrication processes in accordance with aspects of the present disclosure.

As shown in FIG. 6, a dielectric material or stack of dielectric materials 34 may be formed over the semiconductor materials 30, 32. In embodiments, the dielectric material or stack of dielectric materials 34 may be an oxide material and/or nitride material as is known in the art. The dielectric material or stack of dielectric materials 34 may be deposited using a conventional deposition process, e.g., CVD. Following the deposition of the dielectric material or stack of dielectric materials 34, the capping material may be removed to form an opening 36, aligned with and exposing the semiconductor materials 16, 28. The capping material may be removed by any conventional etching processes as is known in the art.

Figure 7:
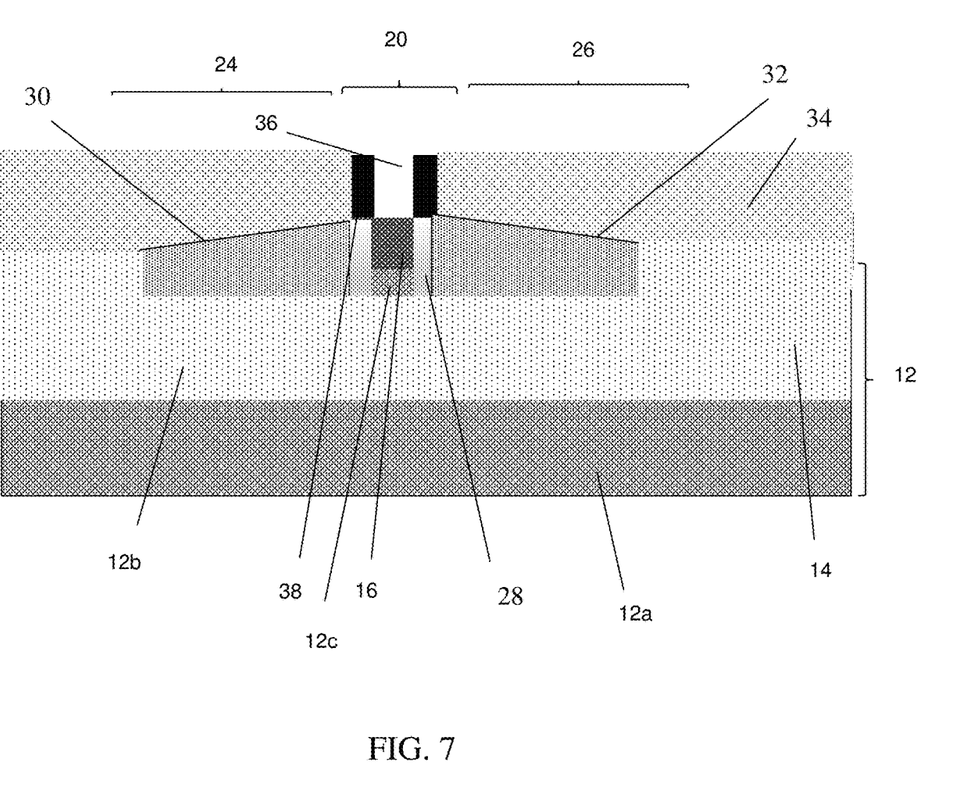
FIG. 7 shows sidewall spacers in the opening, amongst other features, and respective fabrication processes in accordance with aspects of the present disclosure.

In FIG. 7, sidewall spacers 38 may be formed on sidewalls of the opening 36. In embodiments, the sidewall spacers 38 may be a nitride material, for example, which effectively narrows the width of the opening 36. The sidewall spacers 38 may be formed by a conventional deposition process followed by an anisotropic etching process to remove the sidewall material from horizontal surfaces, e.g., leaving the sidewall spacers 34 on sidewalls of the opening 36.

Figure 8:
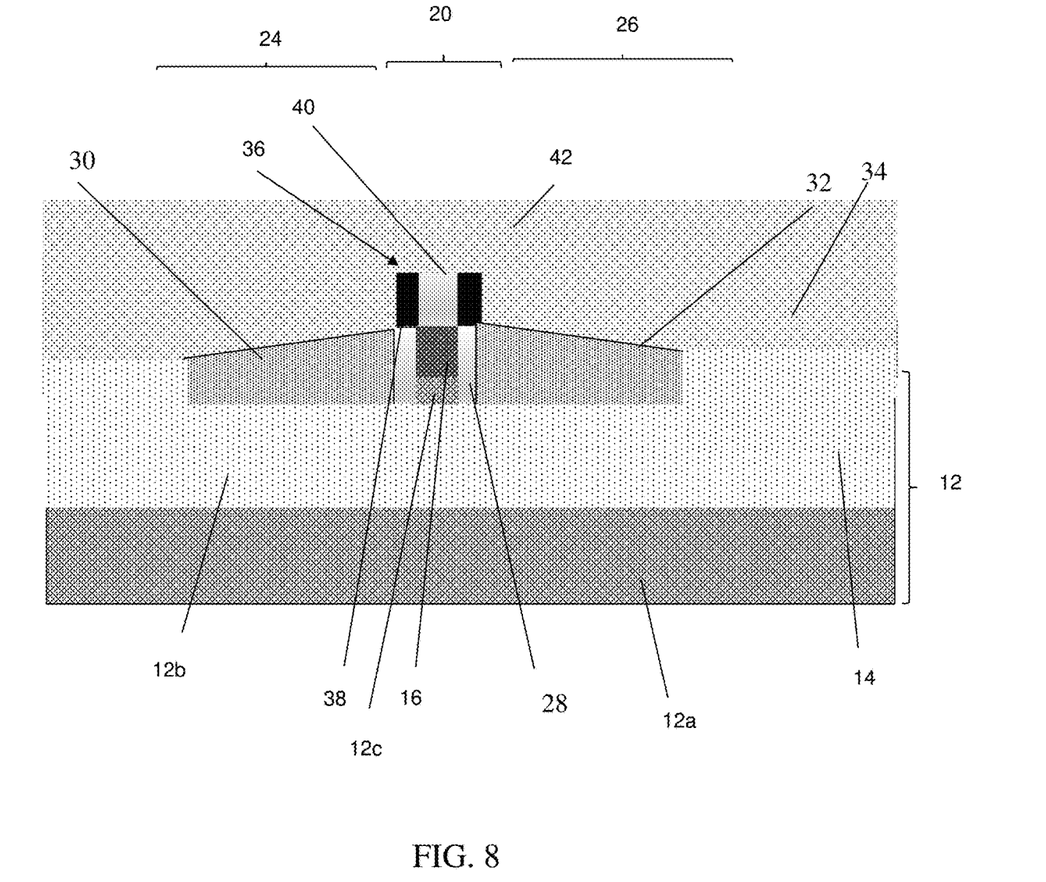
FIG. 8 shows semiconductor material in the opening, amongst other features, and respective fabrication processes in accordance with aspects of the present disclosure.

FIG. 8 shows additional semiconductor material 40 filling the opening 36 within the extrinsic base region 20. In embodiments, the additional semiconductor material 40 may be SiGe that is epitaxially grown within the opening 36. In more specific embodiments, the additional semiconductor material 40 may be SiGe with a P+ dopant, e.g., boron. The SiGe may also have a gradient profile of Ge, as an example. The semiconductor material 40 is self-aligned with the semiconductor materials 16, 28 and in combination will form a raised extrinsic base in the extrinsic base region 20. An interlevel dielectric material or stack of materials 42 may be formed over the semiconductor materials 16, 28, 40 using conventional deposition processes, e.g., CVD.

Figure 9:
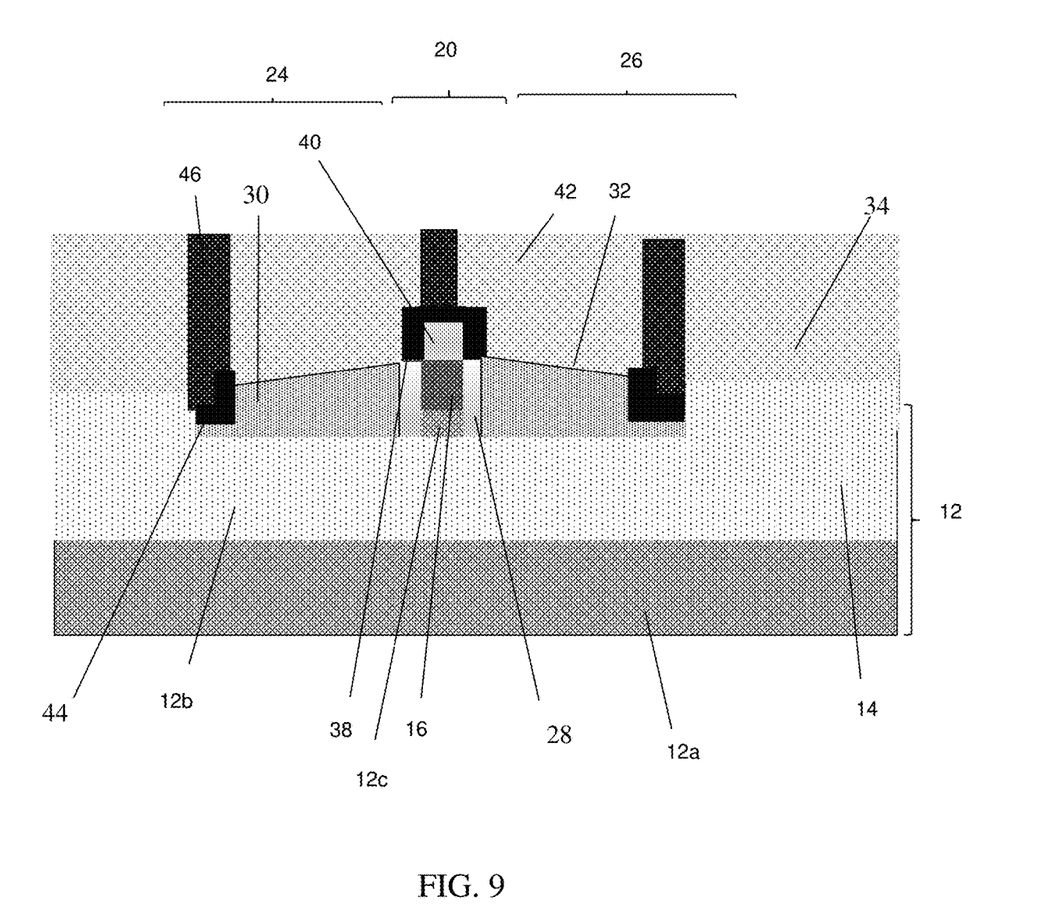
FIG. 9 shows contacts in an emitter region, extrinsic base region, and collector region, amongst other features, and respective fabrication processes in accordance with aspects of the present disclosure.
Figure 10:
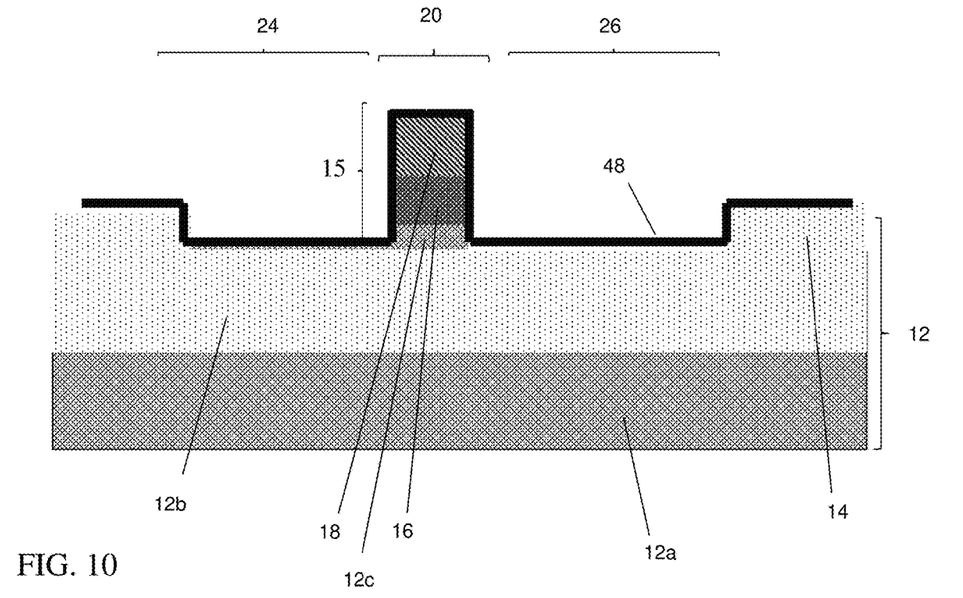
FIGS. 10-13 show alternative fabrication processes and respective structures in accordance with additional aspects of the present disclosure.

FIG. 9 shows contacts 46 in the emitter region 24, extrinsic base region 20 and collector region 26, amongst other features. More specifically, in FIG. 9, contacts 46 may be formed in the emitter region 24, extrinsic base region 20 and the collector region 26, contacting the semiconductor materials 30, 32, 40. To form the contacts 46, trenches are formed in the interlevel dielectric material or stack of materials 42 to expose surfaces of the semiconductor materials 16, 28, 40. A silicide process may be performed on the exposed semiconductor materials 16, 28, 40 to form silicide contacts 44. The silicide contacts 44 are thus formed on the emitter region 24, e.g., raised semiconductor material 30, the collector region 26, e.g., raised semiconductor material 32 and the extrinsic base region 20, e.g., semiconductor material 40. Conductive material may then be deposited within the trenches, over the silicide contacts 44, to form the contacts 46. The conductive material may be tungsten or aluminum, which may also include a barrier liner material. Any excess conductive material on the surface of the interlevel dielectric material or stack of materials 42 may be removed by a conventional CMP process.

FIGS. 10-13 show alternative fabrication processes and respective structures in accordance with aspects of the present disclosure. These fabrication process may be used to form a single sidewall of SiGe material. Starting from FIG. 10, after the patterning of the semiconductor materials 12c, 16 and capping material 18 into the pillar 15, a liner material 48 may be deposited over patterned stack of materials 12, 16, 18, in addition to the insulator layer 12b and the shallow trench isolation structures 14. In embodiments, the liner material 48 may be an oxide/nitride liner deposited by a conventional deposition process, e.g., CVD.

Figure 11:
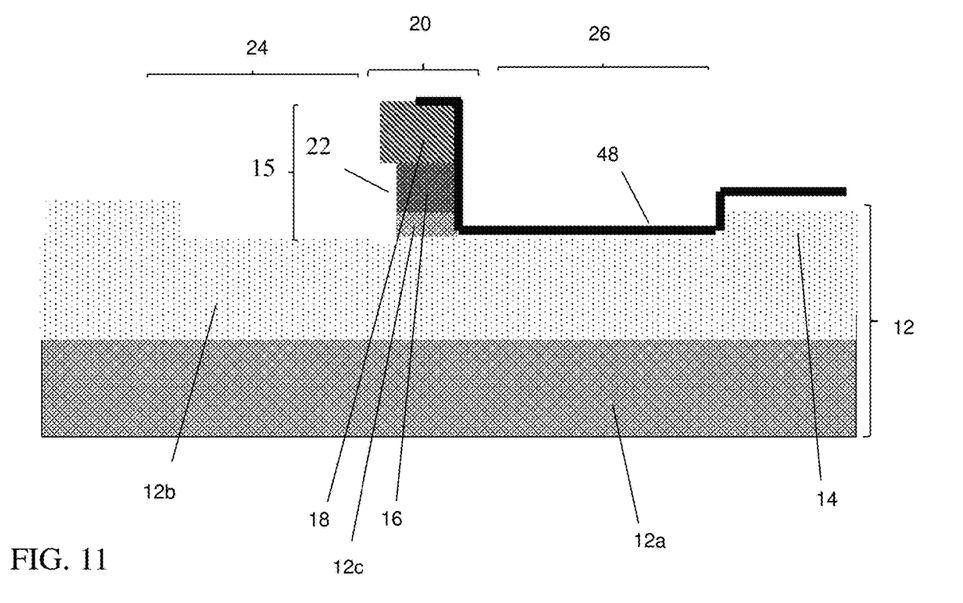

In FIG. 11, the liner material 48 may be removed on the emitter side 24 of the structure. It should be understood, though, that the liner material 48 may alternatively be removed from the collector side 26 of the structure. The liner material 48 may be removed by a conventional lithography and etching processes as is known in the art to expose a single side of the semiconductor material 12c, 16. Thereafter, a recess 22 is formed on the exposed side of the pillar 15 by removing some of the semiconductor materials 12c, 16 as described with respect to FIG. 3.

Figure 12:
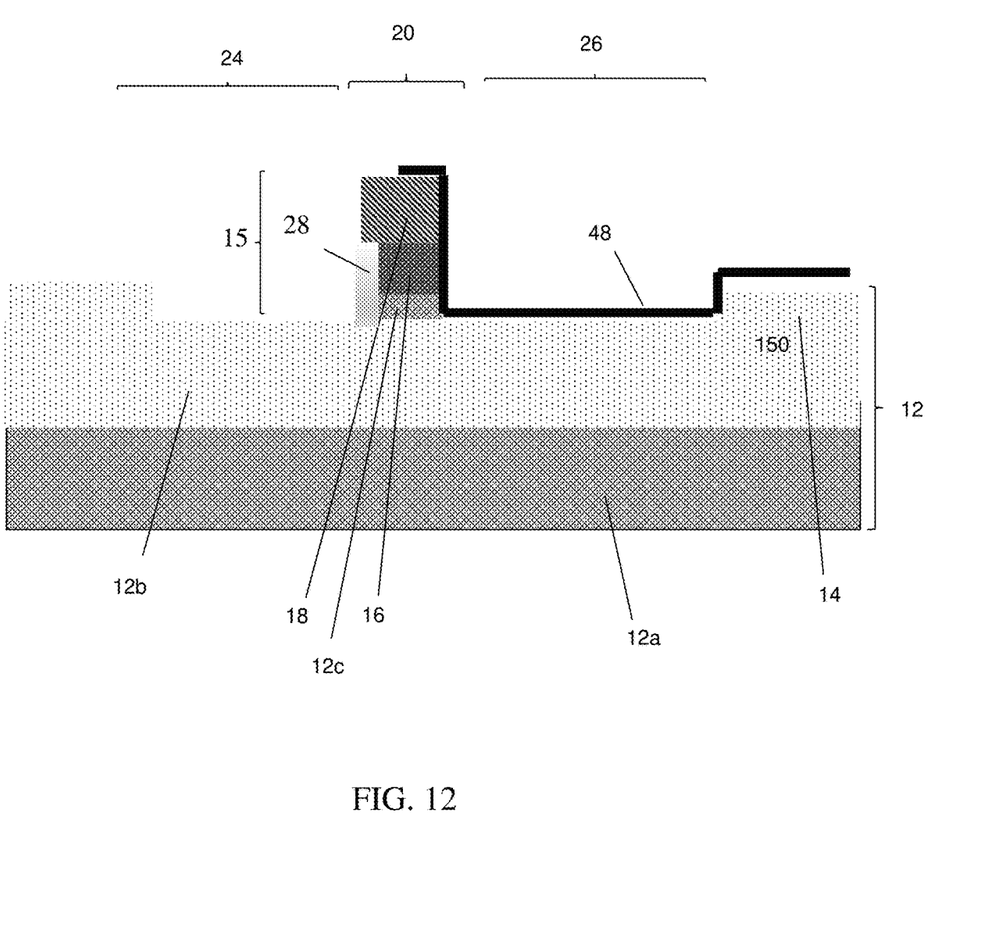

As shown in FIG. 12, an epitaxial semiconductor material 28 may be formed in the recess 22, on a single side of the pillar 15 below the capping material 18, i.e., patterned semiconductor material 16 and semiconductor layer 12c. In embodiments, the semiconductor material 28 may be SiGe material having a depth of about 2 nm to about 40 nm. The SiGe material 28 may comprise a gradient concentration of Ge material, e.g., ranging from a Ge concentration of about 0% to 50%. In embodiments, the gradient concentration of Ge may be from a smaller % concentration of Ge to a larger % concentration of Ge, starting at an inner portion to continuing and to an outer portion. In an alternative embodiment, the grading concentration of the Ge may be from a larger % concentration of Ge to a smaller % concentration of Ge, starting at an inner portion and to continuing to an outer portion.

Figure 13:
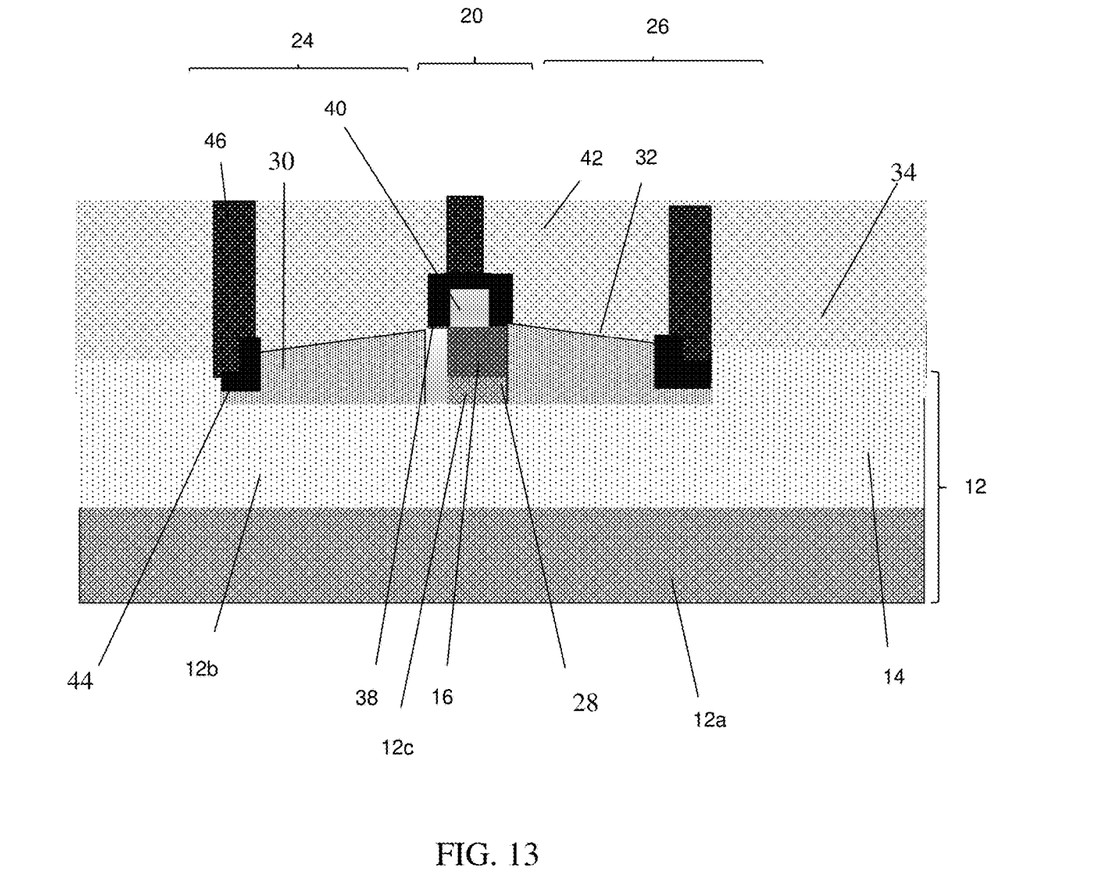

FIG. 13 shows contacts 46 formed in the emitter region 24, extrinsic base region 20 and the collector region 26, contacting the semiconductor materials 30, 32, 40, amongst other features. As previously described, prior to forming the contacts 46, epitaxial semiconductor material 30 may be formed on the emitter side 24 and epitaxial semiconductor material 32 may be formed on the collector side 26 to form a raised emitter region and a raised collector region as described with respect to FIG. 5. A dielectric material or stack of dielectric materials 34 may be formed over the semiconductor materials 30, 32 followed by removal of the capping material to form an opening aligned with and exposing the semiconductor materials 16, 28 as described with respect to FIG. 6. Sidewall spacers 38 may be formed on sidewalls of the opening 36 which is then filled with additional semiconductor material 40 in the extrinsic base region 20 as described with respect to FIG. 8. An interlevel dielectric material or stack of materials 42 may be formed over the semiconductor materials 16, 28, 40. Trenches may be formed in the interlevel dielectric material or stack of materials 42 to expose surfaces of the semiconductor materials 16, 28, 40, followed by fabrication of the silicide contacts 44 and the contacts 46 as described with respect to FIG. 9.

As should be understood by those of skill in the art, the silicide process begins with deposition of a thin transition metal layer, e.g., nickel, cobalt or titanium, over fully formed and patterned semiconductor devices (e.g., semiconductor materials 30, 32, 40). After deposition of the material, the structure is heated allowing the transition metal to react with exposed silicon (or other semiconductor material as described herein) in the active regions of the semiconductor device forming a low-resistance transition metal silicide. Following the reaction, any remaining transition metal is removed by chemical etching, leaving silicide contacts 44 in the active regions of the device.

The contacts 46 may be formed on the silicide contacts 44. In embodiments, the contacts 46 may be tungsten or aluminum formed by conventional deposition processes. For example, a conductive material, e.g., tungsten or aluminum, may be deposited within the trenches and on the silicide contacts 44 to form the contacts 46. Any residual material on the interlevel dielectric material 42 may be removed by a CMP process.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    an extrinsic base comprising at least one sidewall having a gradient concentration of semiconductor material, the extrinsic base comprising a stack of semiconductor material with a first semiconductor material, a second semiconductor material, a third semiconductor material, and an epitaxial semiconductor material comprising the at least one sidewall with the gradient concentration of the semiconductor material, the epitaxial semiconductor material extending along an entire sidewall of the first semiconductor material and the second semiconductor material, and a spacer aligned with and contacting the at least one sidewall comprising the epitaxial semiconductor material, above the second semiconductor material and surrounding the third semiconductor material of the stack of the semiconductor material, wherein the epitaxial semiconductor material comprises p-type material;
    an emitter on a first side of the extrinsic base and comprising a single top sloped surface which at least partially extends above a top surface of shallow trench isolation structures and to a top surface of the epitaxial semiconductor material, the emitter directly contacts the epitaxial semiconductor material with a thickest portion of the emitter extending to and directly contacting the epitaxial semiconductor material; and
    a collector on a second side of the extrinsic base and comprising a single top sloped surface which at least partially extends above the top surface of shallow trench isolation structures and to a top surface of the epitaxial semiconductor material, the collector directly contacts the epitaxial semiconductor material with a thickest portion of the collector extending to and directly contacting the epitaxial semiconductor material,
    wherein the collector and emitter are bounded on a bottom surface by an underlying insulator layer, at a first side surface by the at least one sidewall having the gradient concentration of semiconductor material, at a second side surface by the shallow trench isolation structures and on a top surface by interlevel dielectric material, the interlevel dielectric material also contacts the at least one sidewall and is above the extrinsic base.

2. The structure of claim 1, wherein the emitter is a raised emitter and the collector is a raised collector, and the emitter and the collector covering the at least one sidewall with a first height and extending to the shallow trench isolation structures with a second height that is lower than the first height.

3. The structure of claim 1, wherein the emitter and the collector each comprise a first semiconductor material and the gradient concentration of semiconductor material comprises a different semiconductor material than the first semiconductor material, and emitter and the collector directly contact the at least one sidewall.

4. The structure of claim 3, wherein the emitter and the collector comprise Si material and the semiconductor material comprises SiGe material with a gradient concentration of Ge.

5. The structure of claim 4, wherein the Si material comprises N+Si material and the SiGe material comprises P+SiGe material.

6. The structure of claim 4, wherein the gradient concentration of Ge ranges from about 0% to about 50%.

7. The structure of claim 1, wherein the emitter is adjacent to the at least one sidewall and the stack of semiconductor material of the extrinsic base having a vertical sidewall.

8. The structure of claim 1, wherein the at least one sidewall is a single sidewall comprises a width of about 2 nm to about 40 nm, and the stack of semiconductor material has a non-planar vertical sidewall profile.

9. The structure of claim 1, wherein the third semiconductor material of the extrinsic base comprises SiGe material surrounded by sidewall spacers.

10. The structure of claim 1, wherein the second semiconductor material comprises SiGe material and the first semiconductor material comprises Si material both of which include a recessed sidewall, and the gradient concentration of the semiconductor material is within the recessed sidewall.

11. The structure of claim 1, wherein the at least one sidewall comprises opposing sidewalls each of which comprise the gradient concentration of semiconductor material which surrounds a core of non-gradient semiconductor material therebetween, and the third semiconductor material of the stack of semiconductor material comprising the gradient concentration, and remaining semiconductor material below the third semiconductor material not having a gradient concentration.

12. The structure of claim 1, wherein the second semiconductor material comprises SiGe material and the first semiconductor material comprises Si material with a recess on opposing sides thereof, and the opposing sidewalls each of which comprise the gradient semiconductor material within the recess.

13. A structure comprising:
an extrinsic base comprising a first semiconductor material, a second semiconductor material and a third semiconductor material, and a sidewall of epitaxial semiconductor material extending along an entire sidewall of the first semiconductor material and the second semiconductor material, the sidewall of epitaxial semiconductor material comprising a gradient concentration of semiconductor material, the third semiconductor material comprising a gradient of concentration of semiconductor material different than the first semiconductor material, wherein the sidewall of epitaxial semiconductor material comprises p-type material;
a sidewall spacer above and aligned with the sidewall and surrounding the third semiconductor material above the second semiconductor material;
a raised emitter comprising the first semiconductor material on a first side of the extrinsic base and a single top sloped surface which at least partially extends above a top surface of shallow trench isolation structures and to a top surface of the epitaxial semiconductor material, the raised emitter covering the sidewall with a first height and extending to the shallow trench isolation structures with a second height that is lower than the first height, the raised emitter directly contacts the epitaxial semiconductor material with a thickest portion of the raised emitter extending to and directly contacting the epitaxial semiconductor material; and
a raised collector of the first semiconductor material on a second side of the extrinsic base and a single top sloped surface which at least partially extends above the top surface of shallow trench isolation structures and to a top surface of the epitaxial semiconductor material, the raised collector covering the sidewall with a first height and extending to the shallow trench isolation structures with a second height that is lower than the first height, the raised collector directly contacts the epitaxial semiconductor material with a thickest portion of the raised collector extending to and directly contacting the epitaxial semiconductor material,
wherein the raised collector and raised emitter are bounded on a bottom surface by an underlying insulator layer, at a first side surface by the at least one sidewall having the gradient concentration of semiconductor material, at a second side surface by the shallow trench isolation structures and on a top surface by interlevel dielectric material, the interlevel dielectric material also contacts the at least one sidewall and is above the extrinsic base.

14. The structure of claim 13, wherein the first semiconductor material comprises Si material and the second semiconductor material comprises SiGe material, wherein the raised emitter and the raised collector directly contact the sidewall.

15. The structure of claim 14, wherein the gradient concentration of the second semiconductor material comprises a gradient concentration of Ge material.

16. The structure of claim 15, wherein the gradient concentration of the Ge material comprises about 0% to 50%.

17. The structure of claim 15, further comprising a recess in the first semiconductor material and the second semiconductor material, and the sidewall with the gradient concentration is within the recess.

18. The structure of claim 13, wherein the raised emitter and the raised collector directly contact the sidewall.

19. The structure of claim 13, wherein the extrinsic base comprising opposing sidewalls with the gradient concentration of the second semiconductor material.

20. A method comprising:
forming an extrinsic base comprising at least one sidewall having a gradient concentration of semiconductor material, the extrinsic base comprising a stack of semiconductor material with a first semiconductor material, a second semiconductor material, a third semiconductor material, and an epitaxial semiconductor material comprising the at least one sidewall with the gradient concentration of the semiconductor material, the epitaxial semiconductor material extending along an entire sidewall of the first semiconductor material and the second semiconductor material, and a spacer aligned with and contacting the at least one sidewall comprising the epitaxial semiconductor material, above the second semiconductor material and surrounding the third semiconductor material of the stack of the semiconductor material, wherein the epitaxial semiconductor material comprises p-type material;
forming an emitter on a first side of the extrinsic base and a single top sloped surface which at least partially extends above a top surface of shallow trench isolation structures and to a top surface of the epitaxial semiconductor material, the emitter directly contacts the epitaxial semiconductor material with a thickest portion of the emitter extending to and directly contacting the epitaxial semiconductor material; and
forming a collector on a second side of the extrinsic base and a single top sloped surface which at least partially extends above the top surface of shallow trench isolation structures and to a top surface of the epitaxial semiconductor material, the collector directly contacts the epitaxial semiconductor material with a thickest portion of the collector extending to and directly contacting the epitaxial semiconductor material wherein the collector and emitter are bounded on a bottom surface by an underlying insulator layer, at a first side surface by the at least one sidewall having the gradient concentration of semiconductor material, at a second side surface by the shallow trench isolation structures and on a top surface by interlevel dielectric material, the interlevel dielectric material also contacts the at least one sidewall and is above the extrinsic base.

\* \* \* \* \*